(12) United States Patent
Ibrahim et al.

(10) Patent No.: US 12,068,172 B2
(45) Date of Patent: Aug. 20, 2024

(54) SACRIFICIAL PADS TO PREVENT GALVANIC CORROSION OF FLI BUMPS IN EMIB PACKAGES

(71) Applicant: Intel Corporation, Santa Clara, CA (US)

(72) Inventors: Tarek A. Ibrahim, Mesa, AZ (US); Rahul N. Manepalli, Chandler, AZ (US); Wei-Lun K. Jen, Chandler, AZ (US); Steve S. Cho, Chandler, AZ (US); Jason M. Gamba, Gilbert, AZ (US); Javier Soto Gonzalez, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1115 days.

(21) Appl. No.: 16/525,985

(22) Filed: Jul. 30, 2019

(65) Prior Publication Data
US 2021/0035818 A1 Feb. 4, 2021

(51) Int. Cl.
*H01L 23/498* (2006.01)
*H01L 21/48* (2006.01)
*H01L 23/538* (2006.01)

(52) U.S. Cl.
CPC ........ *H01L 21/4846* (2013.01); *H01L 21/481* (2013.01); *H01L 23/49838* (2013.01); *H01L 23/5386* (2013.01); *H01L 23/5385* (2013.01); *H01L 2224/16225* (2013.01); *H01L 2924/19041* (2013.01); *H01L 2924/19105* (2013.01)

(58) Field of Classification Search
CPC .................. H01L 23/49838; H01L 23/49811
See application file for complete search history.

(56) References Cited

U.S. PATENT DOCUMENTS

| | | | | |
|---|---|---|---|---|
| 6,987,314 B1* | 1/2006 | Yoshida | ............... | H01L 25/105 |
| | | | | 257/773 |
| 9,397,027 B1* | 7/2016 | Chen | ................. | H01L 23/49548 |
| 2004/0227239 A1* | 11/2004 | Murata | .................. | H05K 3/244 |
| | | | | 257/E23.06 |
| 2010/0207265 A1* | 8/2010 | Muthukumar | ........... | H05K 3/28 |
| | | | | 257/692 |
| 2012/0186863 A1* | 7/2012 | Inoue | ..................... | H01L 23/12 |
| | | | | 174/257 |
| 2014/0124242 A1* | 5/2014 | Ito | ..................... | H01L 23/49822 |
| | | | | 174/250 |
| 2016/0284659 A1* | 9/2016 | Chen | ...................... | H01L 24/17 |
| 2018/0053715 A1* | 2/2018 | Ishihara | ............ | H01L 23/49822 |
| 2018/0323129 A1* | 11/2018 | Bang | ................ | H01L 23/49861 |

FOREIGN PATENT DOCUMENTS

JP 2019080043 A * 5/2019 ............. H05K 1/111
WO WO-2019133006 A1 * 7/2019 ......... H01L 21/4857

* cited by examiner

*Primary Examiner* — Michele Fan
(74) *Attorney, Agent, or Firm* — Schwabe, Williamson & Wyatt, P.C.

(57) ABSTRACT

Embodiments disclosed herein include electronic packages and methods of making electronic packages. In an embodiment, the electronic package comprises a package substrate, an array of first level interconnect (FLI) bumps on the package substrate, wherein each FLI bump comprises a surface finish, a first pad on the package substrate, wherein the first pad comprises the surface finish, and wherein a first FLI bump of the array of FLI bumps is electrically coupled to the first pad, and a second pad on the package substrate, wherein the second pad is electrically coupled to the first pad.

13 Claims, 9 Drawing Sheets

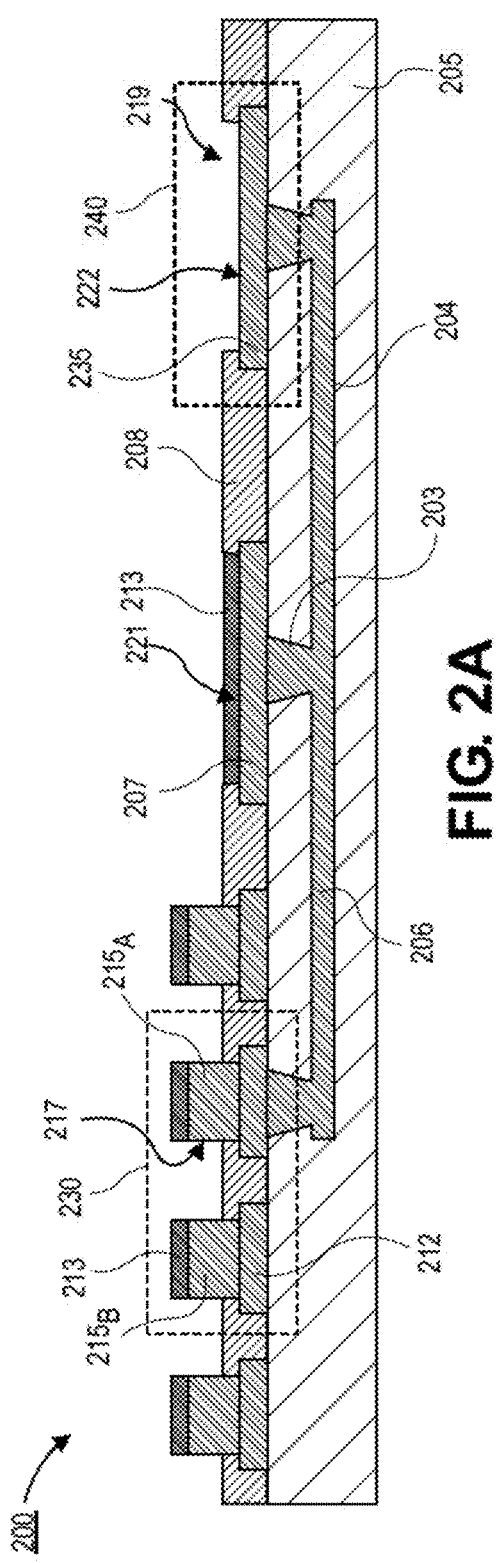
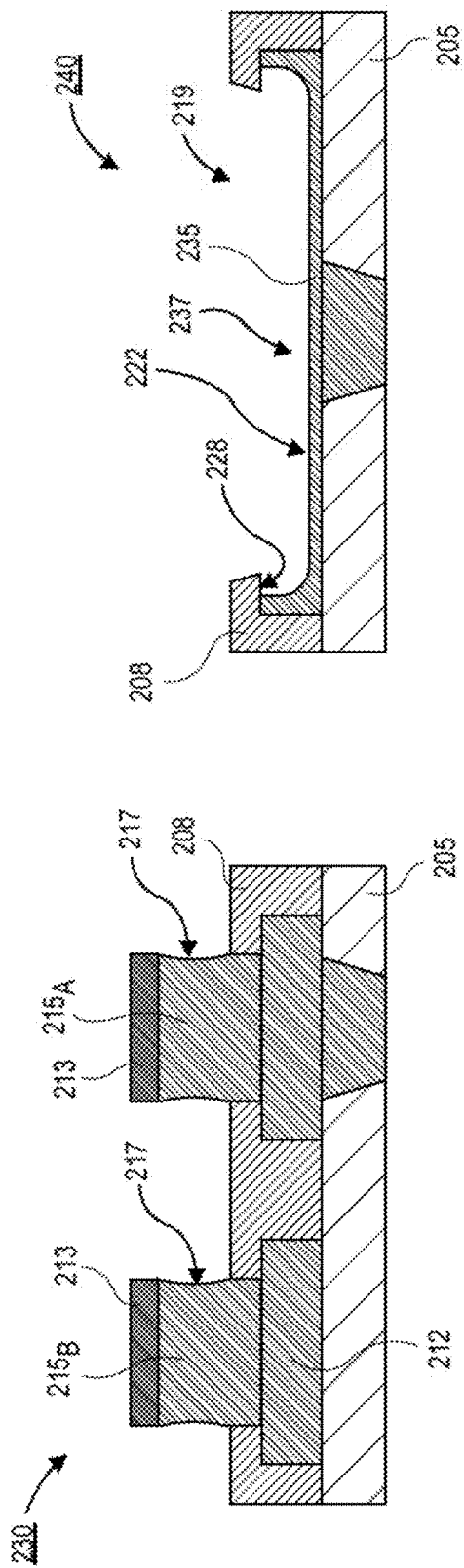
FIG. 2A
FIG. 2B
FIG. 2C

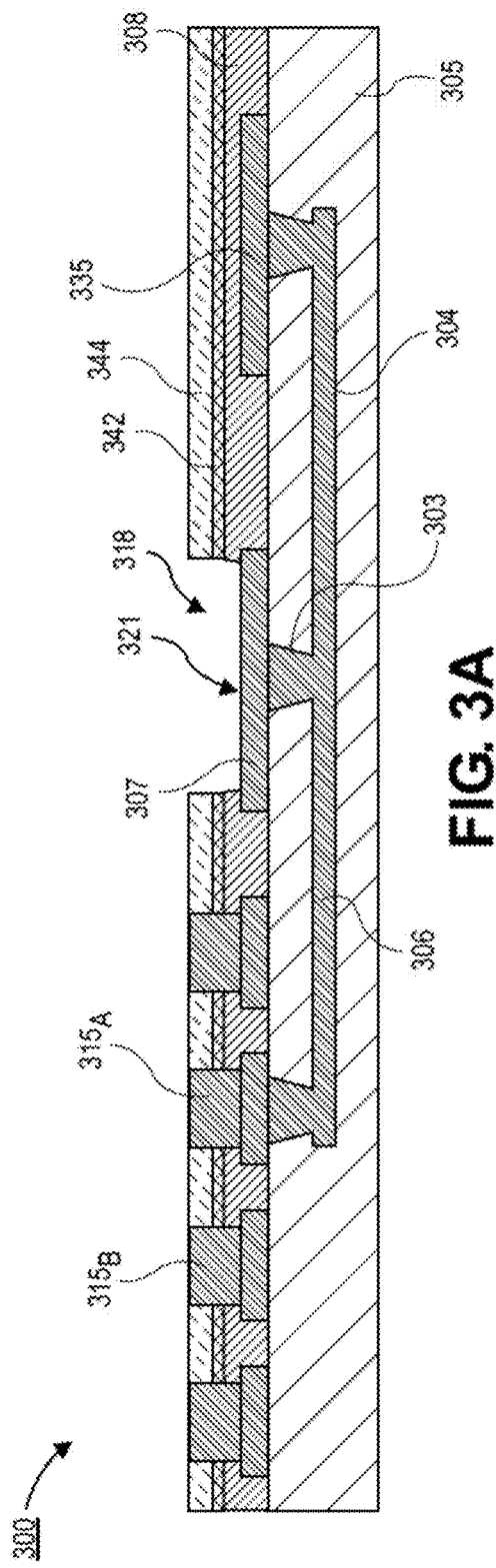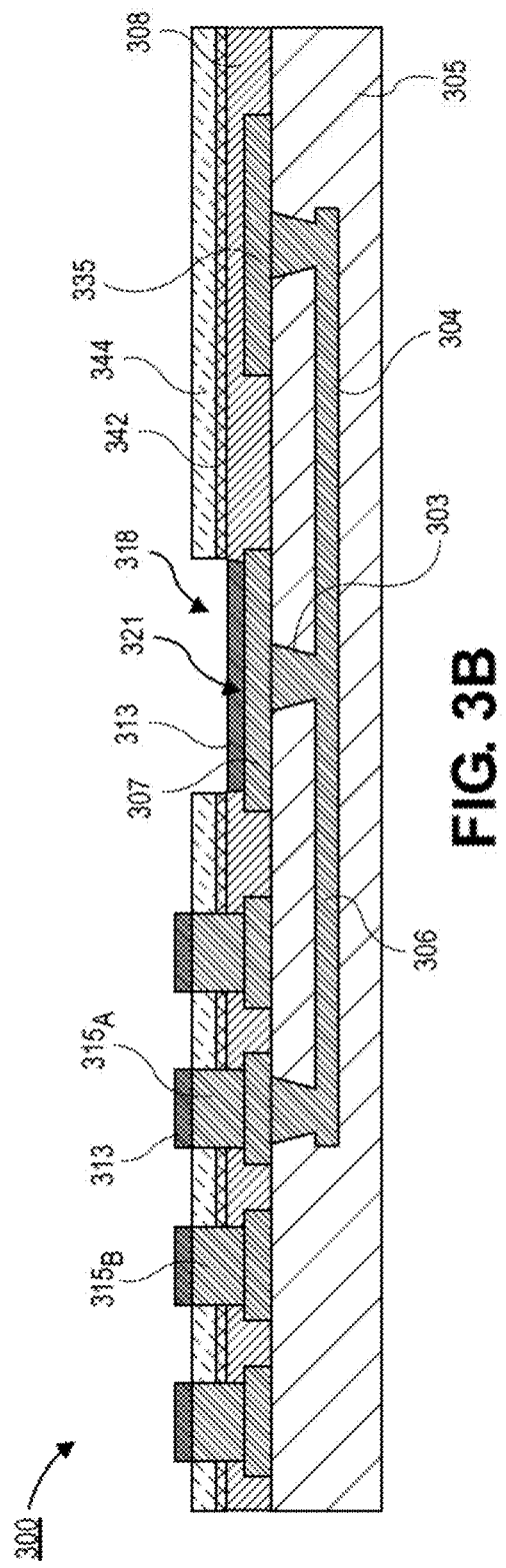

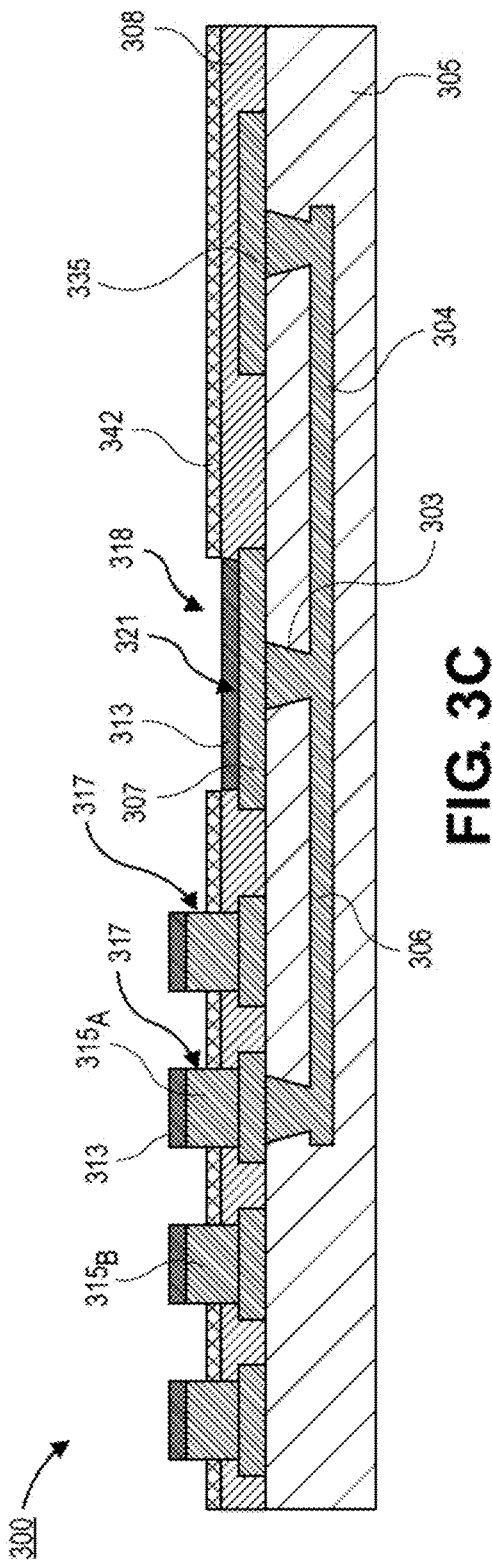
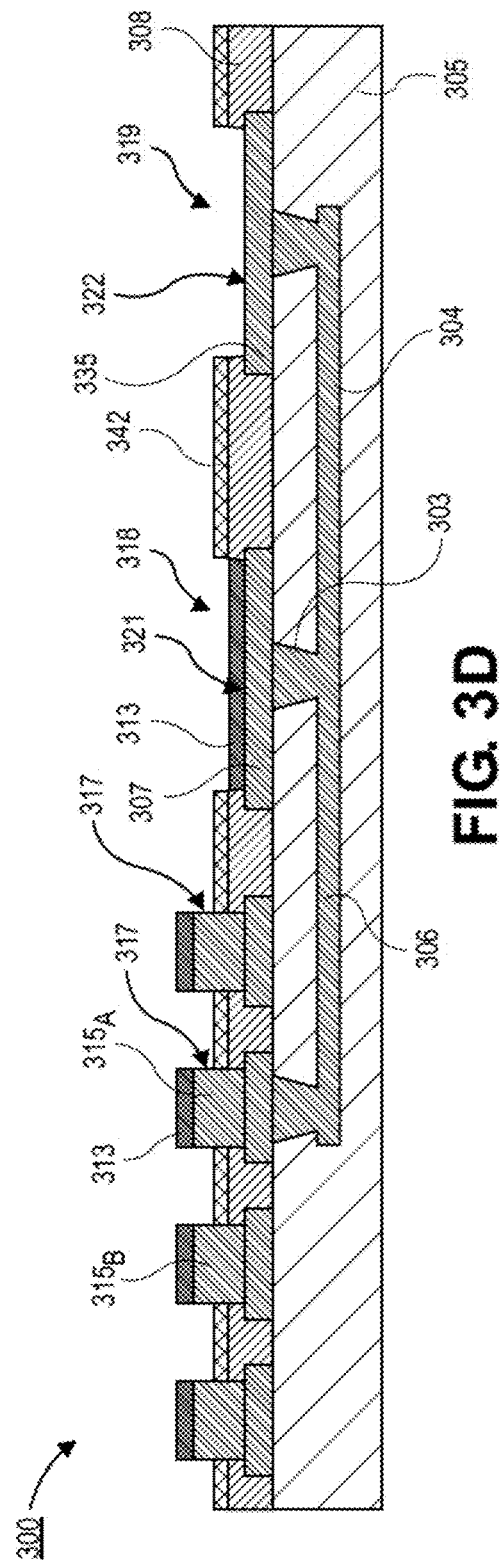
FIG. 3C
FIG. 3D

US 12,068,172 B2

SACRIFICIAL PADS TO PREVENT GALVANIC CORROSION OF FLI BUMPS IN EMIB PACKAGES

TECHNICAL FIELD

Embodiments of the present disclosure relate to semiconductor devices, and more particularly to sacrificial pads for reducing galvanic corrosion of first level interconnect (FLI) bumps in electronic packages.

BACKGROUND

Next generation packaging technologies require the use of first level interconnect (FLI) bumps made of copper pillars with surface finishes in order to enable pitch scaling and reliable assembly yield. In the particular instance of packaging technologies that utilize embedded multi-die interconnect bridge (EMIB) architectures, the surface finish is often an electroless nickel, electroless palladium, immersion gold (ENEPIG) surface finish.

During the manufacturing processes, the seed layer is removed with a seed etching operation after the surface finish is applied. However, it has been found that the surface finish (particularly, the gold of the surface finish) acts as a catalyst for the reduction of hydrogen peroxide. In order to supply the electrons needed for the reaction, copper is oxidized (etched). This is particularly problematic when there are large area differences between the exposed copper and the surface finish, as is the case when FLI bumps are electrically coupled to pads used for die side capacitors (DSCs). It has been shown that copper in the FLI bumps attached to DSC pads may be entirely etched away during a seed layer etch.

BRIEF DESCRIPTION OF THE DRAWINGS

FIG. 2A is a cross-sectional illustration of an electronic package with an FLI bump that is electrically coupled to a first pad and a second pad, in accordance with an embodiment.

FIG. 2B is a zoomed in cross-sectional illustration of the FLI bump and a second FLI bump that is not electrically coupled to pads, in accordance with an embodiment.

FIG. 2C is a zoomed in cross-sectional illustration of the second pad that illustrates that recess formed in the second pad during an etching process, in accordance with an embodiment.

FIG. 3A is a cross-sectional illustration of an electronic package with an array of FLI bumps and a first pad that are exposed through a resist layer, where a first FLI bump of the array is electrically coupled to the first pad and a second pad, in accordance with an embodiment.

FIG. 3B is a cross-sectional illustration of the electronic package after a surface finish is applied to the FLI bumps and the pad, in accordance with an embodiment.

FIG. 3C is a cross-sectional illustration after the resist layer is removed to expose a seed layer, in accordance with an embodiment.

FIG. 3D is a cross-sectional illustration after the second pad is exposed, in accordance with an embodiment.

EMBODIMENTS OF THE PRESENT DISCLOSURE

Described herein are electronic packages with sacrificial pads for reducing galvanic corrosion of first level interconnect (FLI) bumps in electronic packages, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
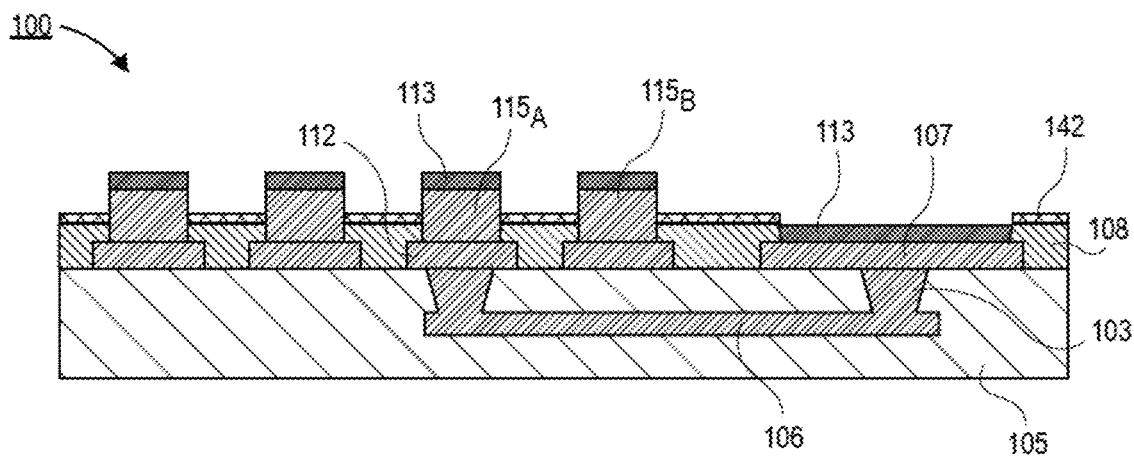
FIG. 1A is a cross-sectional illustration of an electronic package with a pad electrically coupled to a first level interconnect (FLI) bump.

As noted above, unintentional etching of the FLI bump may occur when the FLI bump is electrically coupled to a large pad with a surface finish. For example, in FIG. 1A, an electronic package 100 with an FLI bump 115$_A$ that is connected to a pad 107 by vias 103 and traces 106 in a package substrate 105 is shown. The FLI bump 115$_A$ may be over a pad 112 and pass through a solder resist 108. The FLI bump 115$_A$ and the pad 107 may have surface finishes 113. A seed layer 142 may be disposed over the solder resist 108.

Figure 1B:
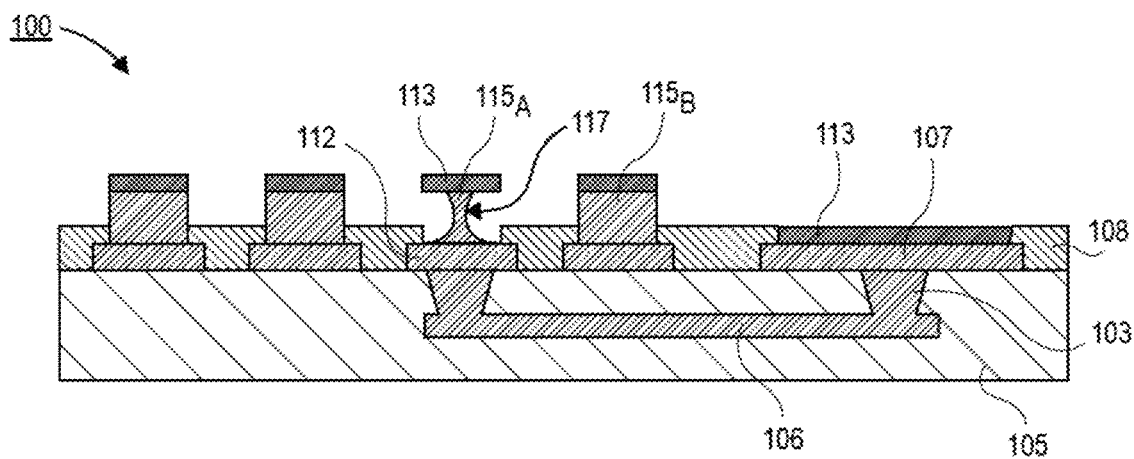
FIG. 1B is a cross-sectional illustration of the electronic package in FIG. 1A after a seed layer is etched and the FLI bump is over etched.

Referring now to FIG. 1B, a cross-sectional illustration of the electronic package 100 after the seed layer is removed with an etching process is shown. The etching process removes the seed layer 142 but also over etches the FLI bump 115$_A$. The FLI bump 115$_A$ is over etched, while the other FLI bumps 115$_B$ that are not attached to the pad 107 are not significantly etched. This is because the surface finish of the pad 107 acts as a catalyst for reduction of hydrogen peroxide in the etching chemistry. Due to the electrical connection between the pad 107 and the FLI bump 115$_A$, the bump has to oxidize (i.e., etch) in order to satisfy the need of electrons for the peroxide reduction. Since the surface area of the pad 107 is significantly larger than an exposed surface area of the sidewall 117 of the FLI bump 115$_A$, most (if not all) of the FLI bump 115$_A$ is etched away.

Figure 1C:
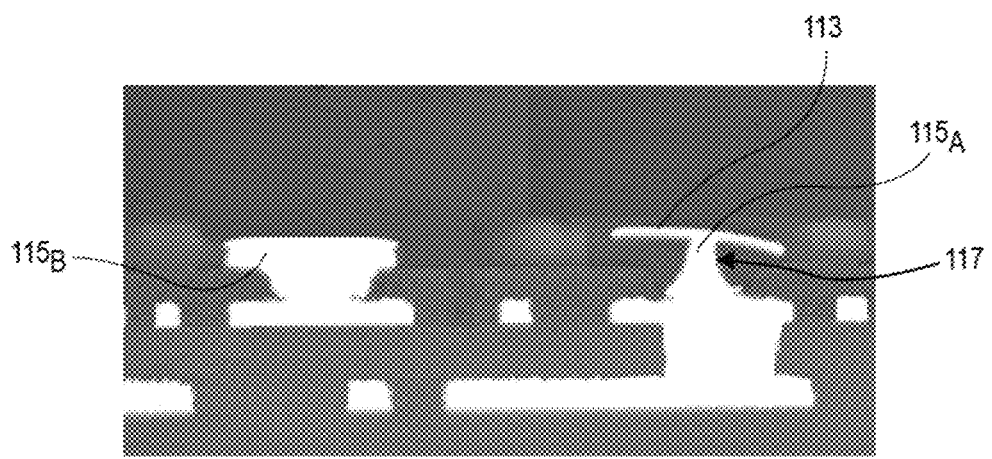
FIG. 1C is an image of an over etched FLI bump.

FIG. 1C is a cross-sectional micrograph that illustrates this phenomenon on an actual package substrate. As shown, the FLI bump 115$_B$ on the left is substantially unaltered, whereas the FLI bump 115$_A$ on the right that is attached to a pad (not shown) is significantly etched. For example, the sidewalls 117 are severely recessed and the surface finish 113 is supported by only a small sliver of the FLI bump 115$_A$. Such over etching results in significant yield and reliability decreases.

Accordingly, embodiments disclosed herein include electronic packages that include sacrificial pads. The sacrificial pads are electrically coupled to the FLI bumps and provide a source of copper that can be preferentially oxidized (i.e., etched) in order to supply electrons to the hydrogen peroxide reduction that is catalyzed by the surface finishes. In an embodiment, the sacrificial pads are preferentially oxidized by controlling ratios of surface area between the exposed surfaces of the FLI bump and the sacrificial pad. For example, providing a sacrificial pad with an exposed surface area that is larger than the exposed surface area of the FLI bump will drive oxidation of the sacrificial pad over oxidation of the FLI bump. In a particular embodiment, the surface area ratio between the sacrificial pad and the FLI bump may be approximately 10:1 or greater, or approximately 100:1 or greater. In an embodiment, the surface area of the sacrificial pad may be substantially similar in magnitude to a surface area of the surface finish that catalyzes the reaction.

Referring now to FIG. 2A, a cross-sectional illustration of an electronic package 200 is shown, in accordance with an embodiment. In an embodiment, the electronic package 200 may comprise a package substrate 205. The package substrate 205 may comprise one or more layers of dielectric material (e.g., laminated layers). The package substrate 205 may comprise conductive features, such as traces, vias, pads, etc. In an embodiment, the package substrate 205 may also comprise embedded features, such as embedded bridges (including passive or active bridges).

In an embodiment, a solder resist 208 may be disposed over a top surface of the package substrate 205. An array of FLI bumps 215 may be disposed over pads 212 and extend up through the solder resist 208. That is, sidewall surfaces 217 of the FLI bumps 215 may be exposed above the solder resist 208. In an embodiment, the FLI bumps 215 may be copper bumps. In an embodiment, one or more first FLI bumps 215$_A$ may be electrically coupled to a first pad 207 adjacent to the array of FLI bumps 215. For example, the first pad 207 may be a pad to which a passive component (not shown) is attached. For example, the passive component may be a capacitor, such as a die side decoupling capacitor (DSC) or the like. In an embodiment, the first FLI bump 215$_A$ may be electrically coupled to the first pad 207 by interconnects that include vias 203, traces 206, or the like. The remainder of the FLI bumps 215$_B$ may be electrically coupled to other circuitry (not shown) of the electronic package 200.

In an embodiment, the FLI bumps 215 and the first pad 207 may comprise a surface finish 213. In a particular embodiment, the surface finish 213 may comprise gold. As noted above, gold may act as a catalyst that drives the unwanted oxidation (i.e., etching) of the first FLI bumps 215$_A$. However, due to reliability concerns, simply removing the gold from the surface finish is not a viable option. While the surface finish 213 is shown as a single layer, it is to be appreciated that the surface finish 213 may comprise any number of materials and layers. For example, the surface finish 213 may comprise a layer of nickel, a layer of palladium, and a topmost layer of gold. One such surface finish 213 may be an electroless nickel, electroless palladium, immersion gold (ENEPIG) surface finish 213.

In order to prevent the unwanted over etching of the first FLI bumps 215$_A$, embodiments may include a second pad 235 that is electrically coupled to the first FLI bump 215$_A$. For example, the second pad 235 may be electrically coupled to the first FLI bump 215$_A$ by a conductive trace 204 and vias 203, or the like. In an embodiment, the second pad 235 may be referred to as a sacrificial pad in some embodiments. That is, the second pad 235 is used as a sacrificial anode and serves as a source of copper that will be sacrificially etched during the removal of the seed layer (not shown). In some embodiments, the second pad 235 only functions as a sacrificial pad, and there are no components attached to a top surface 222 of the second pad 235 in the finished product.

In order to drive preferential etching of the second pad 235 over etching of the first FLI bump 215$_A$, an exposed surface area of the second pad 235 is larger than an exposed surface area of the first FLI bump 215$_A$. For example, an exposed area of the top surface 222 of the second pad 235 that is exposed by an opening 219 through the solder resist 208 is larger than an exposed surface area of sidewalls 217 of the first FLI bump 215$_A$. In a particular embodiment, the exposed surface area of the top surface 222 of the second pad 235 may be approximately ten times or more than an exposed surface area of the sidewalls 217 of the first FLI bump 215$_A$. In an embodiment, the exposed surface area of the top surface 222 of the second pad 235 may be approximately 100 times or more than an exposed surface area of the sidewalls 217 of the first FLI bump 215$_A$. In some embodiments, the exposed surface area of the top surface 222 of the second pad 235 may be substantially similar to an area of the surface finish 213 over a top surface 221 of the first pad 207.

Referring now to FIG. 2B, a zoomed in cross-sectional illustration of region 230 of the electronic package 200 is shown, in accordance with an embodiment. Region 230 provides a more detailed illustration of the first FLI bump 215$_A$ and the second FLI bump 215$_B$. As shown, both the first FLI bump 215$_A$ and the second FLI bump 215$_B$ may comprise sidewall surfaces 217 that exhibit some degree of etching. That is, the sidewall surfaces 217 may not be substantially vertical in some embodiments. This is the result of the etching chemistry used to remove the seed layer (not shown) partially etching the sidewall surfaces 217 after the seed layer is removed. However, it is to be appreciated that the minimal etching does not significantly degrade performance or reliability. Due to the presence of the second pad 235, the first FLI bump 215$_A$ may exhibit sidewall etching that is similar to that of the second FLI bump 215$_B$. That is, there is no substantial over etching as is the case described above when there is no second pad 235 connected to the first FLI bump 215$_A$.

Referring now to FIG. 2C, a zoomed in cross-sectional illustration of region 240 of the electronic package 200 is shown, in accordance with an embodiment. In an embodiment, the region 240 more clearly illustrates a profile of the second pad 235 after a seed layer etching process. As shown, a recess 237 is formed into the second pad 235. The recess may be characterized as a recess 237 formed with a substantially isotropic etching process. For example, the recess 237 may have a substantially flat top surface 222 with curved corners. In an embodiment, the recess 237 may also extend below portions of the solder resist 208 to produce an overhang 228. That is, the edge of the recess 237 may extend past edges of the opening 219 in the solder resist 208. In the illustrated embodiment, residual portions of the second pad 235 remain as a unified piece after the seed layer etching process. However, it is to be appreciated that the etching process may result in the second pad 235 having discontinuities. That is, the etching process may segment the second pad 235 in some embodiments. In yet another embodiment, the second pad 235 may be completely removed by the etching process.

Referring now to FIGS. 3A-3F, a series of cross-sectional illustrations depicting a process for fabricating an electronic package using a sacrificial pad to protect the FLI bumps is shown, in accordance with an embodiment.

Referring now to FIG. 3A, a cross-sectional illustration of an electronic package 300 is shown, in accordance with an embodiment. In an embodiment, the electronic package 300 may comprise a package substrate 305. The package substrate 305 may comprise conductive features (e.g., traces, vias, pads, etc.), embedded components (e.g., interposers, bridges, etc.), or the like. In an embodiment, the package substrate 305 may be substantially similar to the package substrate 205 described above.

In an embodiment, a solder resist 308 may be disposed over a top surface of the package substrate 305. A seed layer 342 may be disposed over a top surface of the solder resist 308. In an embodiment, a resist layer 344 may be disposed over the seed layer 342. In an embodiment, the resist layer 344 may be used in part to pattern an array of FLI bumps 315 disposed over the package substrate 305. In an embodiment, the FLI bumps 315 may extend up through a solder resist 308 and the resist layer 344. Top surfaces of the FLI bumps 315 may be exposed. In an embodiment, the FLI bumps 315 may be copper bumps.

In an embodiment, a top surface 321 of a first pad 307 may also be exposed through an opening 318 in the solder resist 308 and the resist layer 344. In an embodiment, the first pad 307 may be a pad to which a component (not shown) is attached. For example, the first pad 307 may be a pad to which a passive component, such as a capacitor, is attached. In an embodiment, the passive component may be a DSC or the like. In an embodiment, the first pad 307 is electrically coupled to a first FLI bump $315_A$ of the array of FLI bumps 315. For example, the first FLI bump $315_A$ may be electrically coupled to the first pad 307 by interconnects, such as trace 306 and vias 303.

In an embodiment, the electronic package 300 may further comprise a second pad 335. In an embodiment, the second pad 335 is a sacrificial pad that is used to prevent (or limit) over etching of the first FLI bump $315_A$ during the removal of the seed layer 342. In an embodiment, the second pad 335 is entirely covered by the solder resist 308. Covering the second pad 335 prevents the deposition of the surface finish onto the second pad 335 in subsequent processing operations.

In an embodiment, the second pad 335 may be electrically coupled to the first FLI bump $315_A$. For example, an interconnect comprising a trace 304 and a via 303 may electrically couple the second pad 335 to the first FLI bump $315_A$ and the first pad 307. That is, the first FLI bump $315_A$ is electrically coupled to the first pad 307 and to the second pad 335. In an embodiment, second FLI bumps $315_B$ may be electrically coupled to circuitry of the electronic package 300 that is not illustrated in FIG. 3A.

Referring now to FIG. 3B, a cross-sectional illustration of the electronic package 300 after a surface finish 313 is applied to exposed surfaces is shown, in accordance with an embodiment. In an embodiment, the surface finish 313 may comprise gold. For example, a topmost surface of the surface finish 313 may be gold. While the surface finish 313 is shown as a single layer, it is to be appreciated that the surface finish 313 may comprise any number of materials and layers. For example, the surface finish 313 may comprise a layer of nickel, a layer of palladium, and a topmost layer of gold. One such surface finish 313 may be an electroless nickel, electroless palladium, immersion gold (ENEPIG) surface finish 313. In an embodiment, the surface finish 313 of the FLI bumps 315 may be substantially the same surface finish 313 that is on the first pad 307. Since the second pad 335 is covered during the plating of the surface finish 313, it remains bare copper. Accordingly, once exposed, it will provide a source of copper for the peroxide reduction during the etching of the seed layer 342 and function as a sacrificial pad.

Referring now to FIG. 3C, a cross-sectional illustration of the electronic package 300 after the resist layer 344 is stripped is shown, in accordance with an embodiment. In an embodiment, the resist layer 344 may be removed with any suitable process. The removal of the resist layer 344 exposes the seed layer 342. Additionally, the removal of the resist layer 344 exposes sidewall surfaces 317 of the FLI bumps 315. That is, the FLI bumps 315 extend up through the solder resist 308.

Referring now to FIG. 3D, a cross-sectional illustration of the electronic package 300 after the second pad 335 is exposed is shown, in accordance with an embodiment. In an embodiment, an opening 319 may be formed through the seed layer 342 and the solder resist 308. For example, the opening 319 may be formed with a laser ablation process, or the like. In an embodiment, the opening 319 exposes a top surface 322 of the second pad 335.

In order to drive preferential etching of the second pad 335 over etching of the first FLI bump $315_A$, an exposed surface area of the second pad 335 is larger than an exposed surface area of the first FLI bump $315_A$. For example, an area of the top surface 322 of the second pad 335 exposed by the opening 319 through the solder resist 308 is larger than an exposed surface area of sidewalls 317 of the first FLI bump $315_A$. In a particular embodiment, the exposed surface area of the top surface 322 of the second pad 335 may be approximately ten times or more than an exposed surface area of the sidewalls 317 of the first FLI bump $315_A$. In an embodiment, the exposed surface area of the top surface 322 of the second pad 335 may be approximately 100 times or more than an exposed surface area of the sidewalls 317 of the first FLI bump $315_A$. In some embodiments, the exposed surface area of the top surface 322 of the second pad 335 may be substantially similar to an exposed area of the surface finish 313 over a top surface 321 of the first pad 307.

Figure 3E:
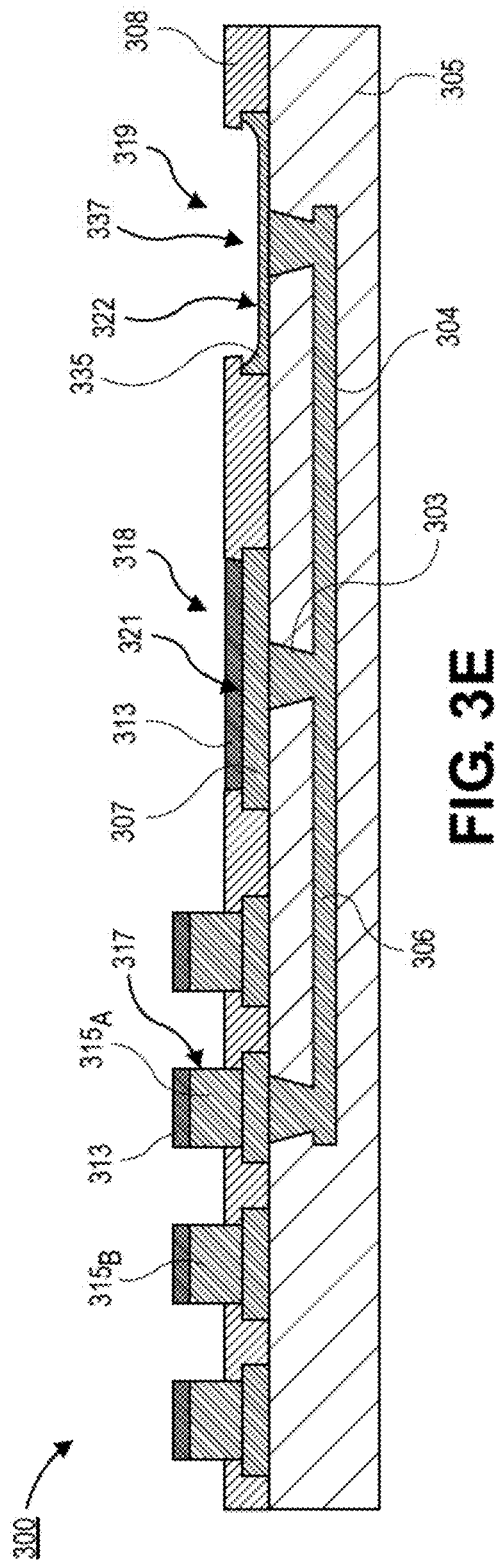
FIG. 3E is a cross-sectional illustration after the seed layer is removed with a seed layer etching process, where the second pad functions as a sacrificial pad, in accordance with an embodiment.

Referring now to FIG. 3E, a cross-sectional illustration of the electronic package after the seed layer 342 is removed is shown, in accordance with an embodiment. In an embodiment, the seed layer 342 may be removed with an etching process. For example, typical seed layer etching chemistries may comprise hydrogen peroxide based solutions. Additives may be added to the peroxide solution to either protect electrolytic copper or enhance the etch rate of the seed layer of electroless copper. The etchant chemistry is designed to make the reduction of peroxide as the rate limiting step with Equation 1 showing the reduction reaction and Equation 2 showing the oxidation reaction.

$$H_2O_2 + 2H^+ + 2e^- \rightarrow 2H_2O \qquad \text{Equation 1}$$

$$Cu \rightarrow Cu^{2+} + 2e^- \qquad \text{Equation 2}$$

The oxidation reaction is the etch of the electroless copper seed layer, which is kinetically controlled by the reduction or degradation of the peroxide species.

However, in the case of the FLI bump architecture with first FLI bumps $315_A$ electrically coupled to the first pad 307, the reaction in Equation 1 is enhanced since the gold of the surface finish acts as a catalyst for reduction of hydrogen peroxide. Due to the relatively large surface area of the surface finish 313 over the first pad 307 (relative to the exposed surface area of the sidewalls 317 of the first FLI bump $315_A$), the rate of the reaction in Equation 1 significantly increases. As a result, the first FLI bump $315_A$ that is electrically coupled to the first pad 307 must also undergo significant increase in reaction rate to accommodate the enhanced reduction of peroxide.

In order to prevent the oxidation reaction from occurring at the first FLI bump $315_A$, the second pad 335 serves as a sacrificial pad. While both the first FLI bump $315_A$ and the second pad 335 are connected to the first pad 307, the second pad is preferentially etched instead of the first FLI bump $315_A$ because of the larger surface area of exposed copper, as described above. Accordingly, the second pad 335 exhibits a substantially isotropically etched recess 337. The recess 337 may have a substantially flat top surface 322 and exhibit undercutting below the edge of the opening 319 in the solder resist 308. While the second pad 335 will be preferentially etched, it is to be appreciated that sidewalls 317 of the first FLI pad $315_A$ may also be etched to some degree. However, the etching of the sidewalls 317 of the first FLI pad $315_A$ may be similar in degree to etching of the sidewalls 317 of the second FLI pads $315_B$ that are not connected to a first pad 307. That is, in some embodiments, the sidewalls 317 of the first FLI pads $315_A$ may not be substantially vertical.

Figure 3F:
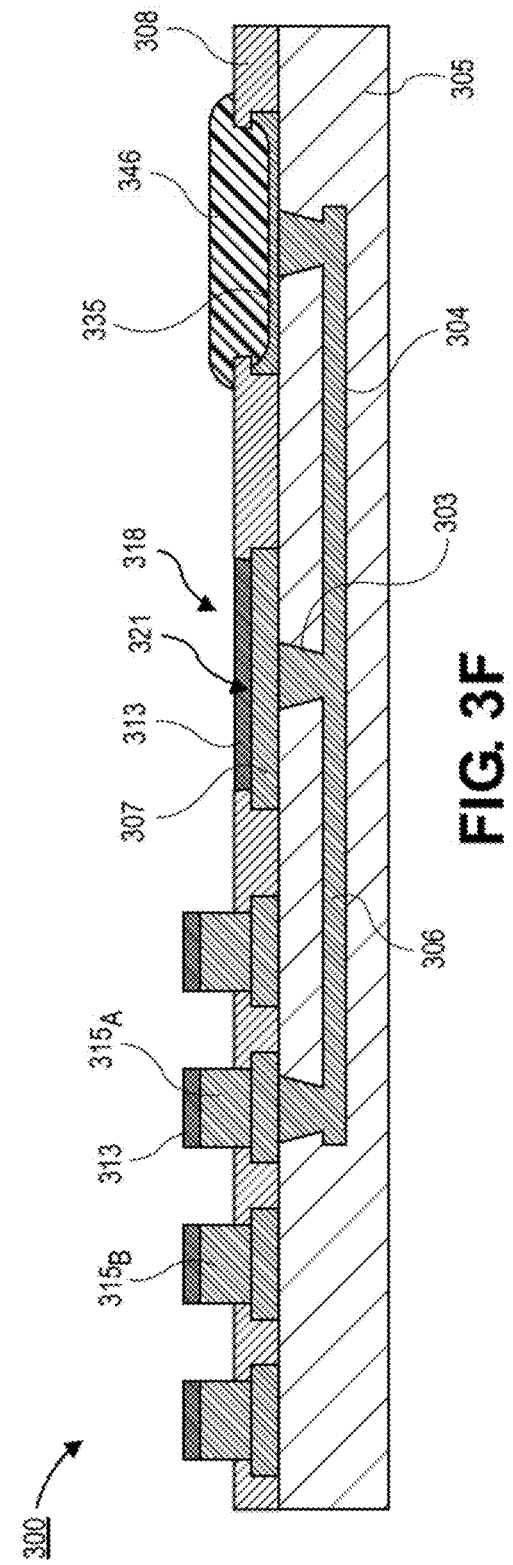
FIG. 3F is a cross-sectional illustration after an electrically insulating layer is disposed over the second pad, in accordance with an embodiment.

Referring now to FIG. 3F, a cross-sectional illustration of the electronic package 300 after an insulating layer 346 is disposed over the second pad 335 is shown, in accordance with an embodiment. After the removal of the seed layer 342, the second pad 335 no longer is needed as part of the circuitry of the electronic package 300. That is, there are no components directly connected to the top surface of the second pad 335. Accordingly, an insulating layer 346 may be disposed over an entire exposed surface of the second pad 335. The insulating layer 346 may fill the recess 337 including the undercut region below the edge of the opening 319 in the solder resist 308. In an embodiment, the insulating layer 346 may be an insulating ink, an epoxy, or any other suitable nonconductive material.

Figure 4A:
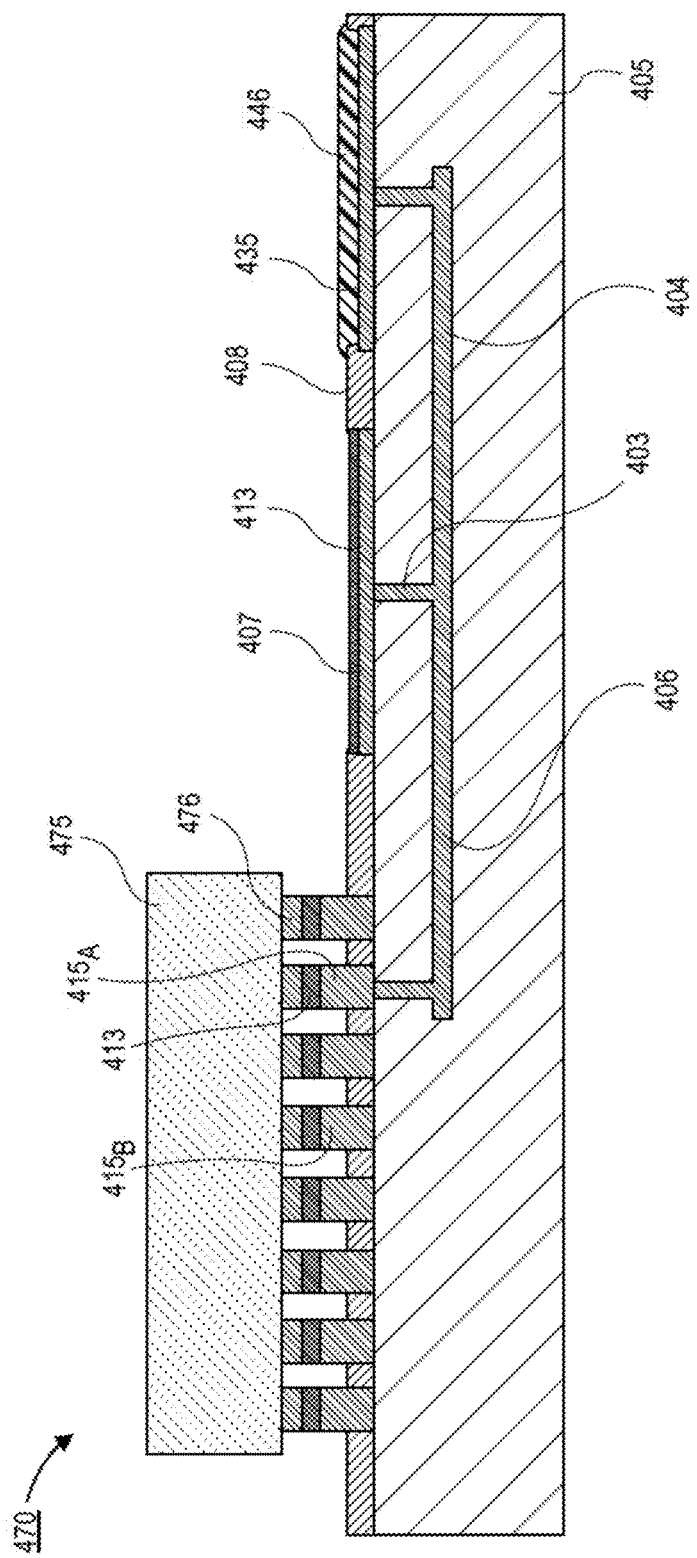
FIG. 4A is a cross-sectional illustration of an electronic package with a die attached to a package substrate by FLI bumps, where one of the FLI bumps is electrically coupled to a first pad and a second pad, in accordance with an embodiment.

Referring now to FIG. 4A, a cross-sectional illustration of an electronic system 470 is shown, in accordance with an embodiment. In an embodiment, the electronic system 470 comprises a package substrate 405 and a die 475 electrically coupled to the package substrate 405. The die 475 may be electrically coupled to the package substrate 405 by an array of FLI bumps 415. For example, die pads 476 may be attached to the surface finish 413 over top surfaces of the FLI bumps 415. In an embodiment, the die pads 476 are directly attached to the surface finish 413. In other embodiments, a solder bump may separate the die pads 476 from the surface finish 413.

In an embodiment, the electronic system 470 may comprise first FLI bumps $415_A$ that are electrically coupled to a first pad 407 and a second pad 435. For example, the first FLI bump $415_A$ may be electrically coupled to the first pad 407 and the second pad 435 by conductive traces 406, 404, and vias 403. Second FLI bumps $415_B$ may be electrically coupled to other circuitry (not shown) of the package substrate 405.

In an embodiment, the first pad 407 may have a surface finish 413. In an embodiment, the surface finish 413 may be the same surface finish 413 over the FLI bumps 415. In a particular embodiment, the surface finish 413 may comprise gold. For example, the surface finish 413 may comprise an ENEPIG surface finish or the like. In an embodiment, the second pad 435 may be covered by an insulating layer 446. The insulating layer 446 may cover portions of a top surface of the second pad 435 that are not covered by the solder resist 408.

Figure 4B:
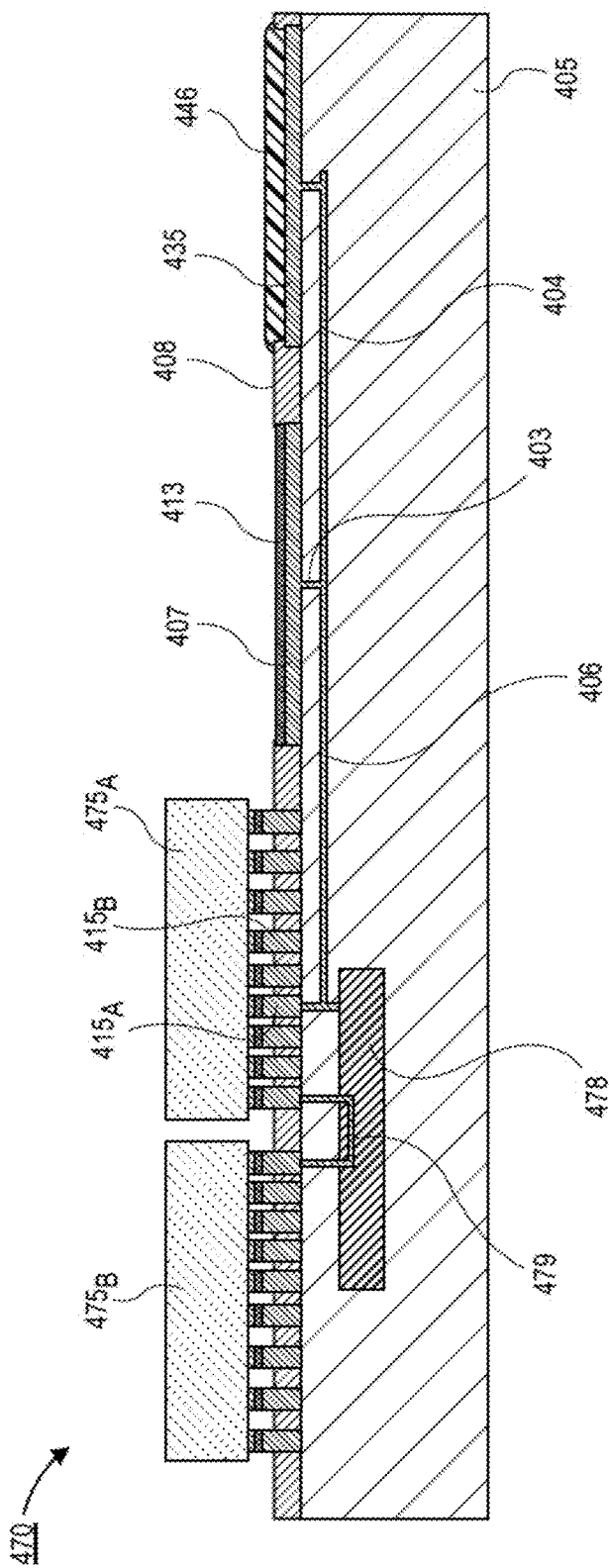
FIG. 4B is a cross-sectional illustration of an electronic package with a pair of dies electrically coupled together by a bridge substrate embedded in a package substrate, where one of the FLI bumps electrically coupled to the bridge substrate is also electrically coupled to a first pad and a second pad, in accordance with an embodiment.

Referring now to FIG. 4B, a cross-sectional illustration of an electronic system 470 is shown, in accordance with an additional embodiment. In an embodiment, the electronic system 470 may be similar to the electronic system in FIG. 4A, with the exception that a first die $475_A$ and a second die $475_B$ are attached to the package substrate 405. In an embodiment, the first die $475_A$ and the second die $475_B$ may be electrically coupled to each other by a bridge 478. In an embodiment, the bridge 478 is embedded in the package substrate 405. The bridge 478 may comprise high density conductive routing 479 to provide a connection between the first die $475_A$ and the second die $475_B$. In an embodiment, the FLI bumps 415 over the bridge 478 may have a tighter pitch than FLI bumps 415 that are not connected to the bridge 478. In an embodiment, a first FLI bump $415_A$ may be one of the bumps over the bridge 478. Accordingly, the first FLI bump $415_A$ may be electrically coupled to the first pad 407, the second pad 435, and the bridge 478.

Figure 5:
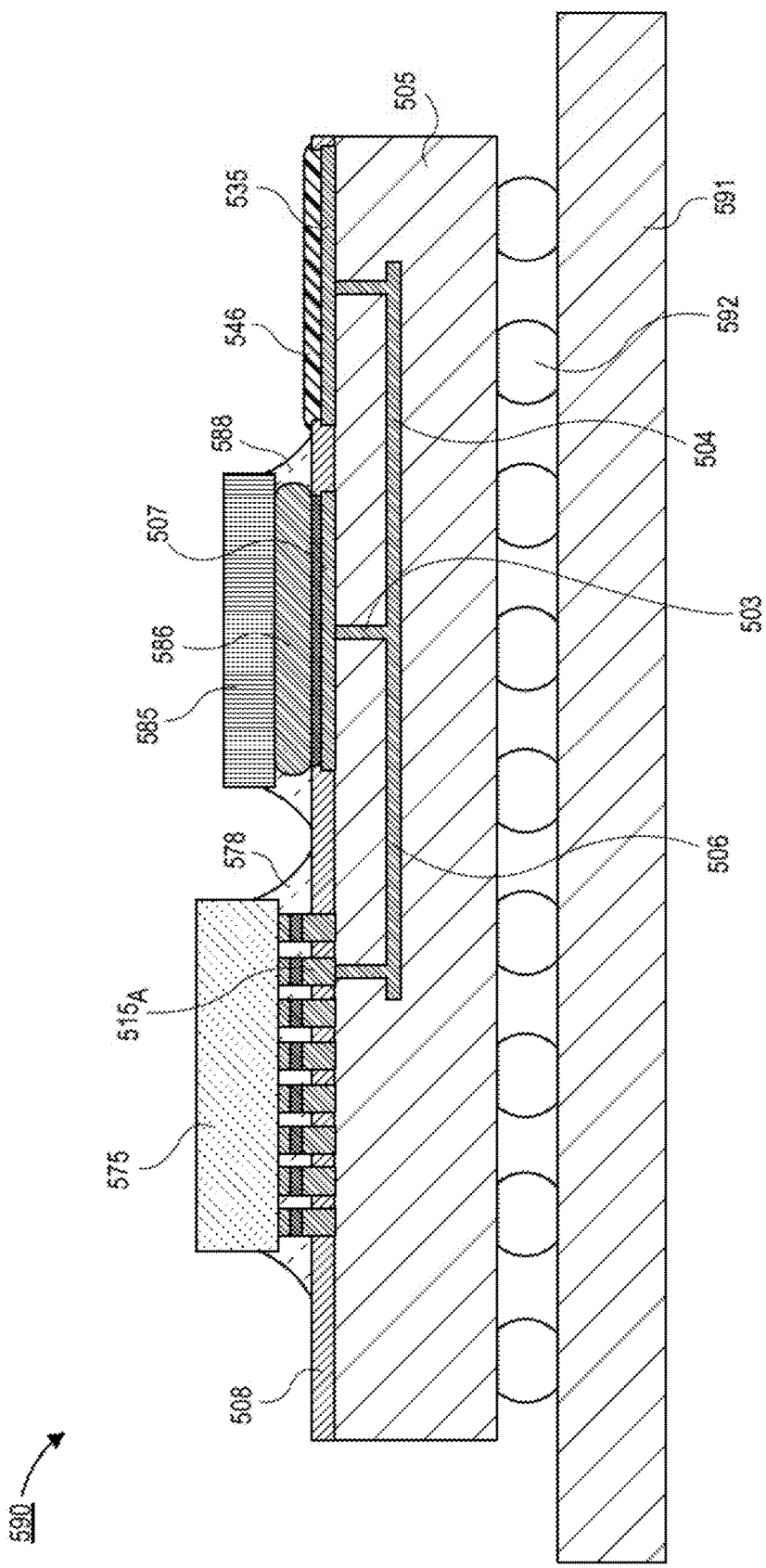
FIG. 5 is a cross-sectional illustration of an electronic system that includes an FLI bump that is electrically coupled to a first pad and a second pad, in accordance with an embodiment.

Referring now to FIG. 5, a cross-sectional illustration of an electronic system 590 is shown, in accordance with an embodiment. In an embodiment, the electronic system 590 may comprise a board 591 that is electrically coupled to a package substrate 505. In an embodiment, the package substrate 505 may be electrically coupled to the board 591 by interconnects 592. In the illustrated embodiment, the interconnects 592 are shown as solder balls. However, it is to be appreciated that the interconnects 592 may be any suitable architecture, such as wire bonds, sockets, or the like.

In an embodiment, the electronic system 590 may comprise a die 575 that is electrically coupled to the package substrate 505 by FLI bumps 515. In an embodiment, the FLI bumps 515 may extend above a solder resist 508. In a particular embodiment, a first FLI bump $515_A$ is electrically coupled to a first pad 507 and a second pad 535 by traces 506, 504, and vias 503. In an embodiment, a component 585 may be electrically coupled to the first pad 507 by an interconnect 586 (e.g., a solder bump or the like). In an embodiment, the component 585 may be a passive component, such as a DSC. In an embodiment, the second pad 535 may be covered by an insulating layer 546. In an embodiment, the insulating layer 546 may be a different material than underfill material 578 or 588 around the FLI bumps $515_A$ and the interconnect 586.

Figure 6:
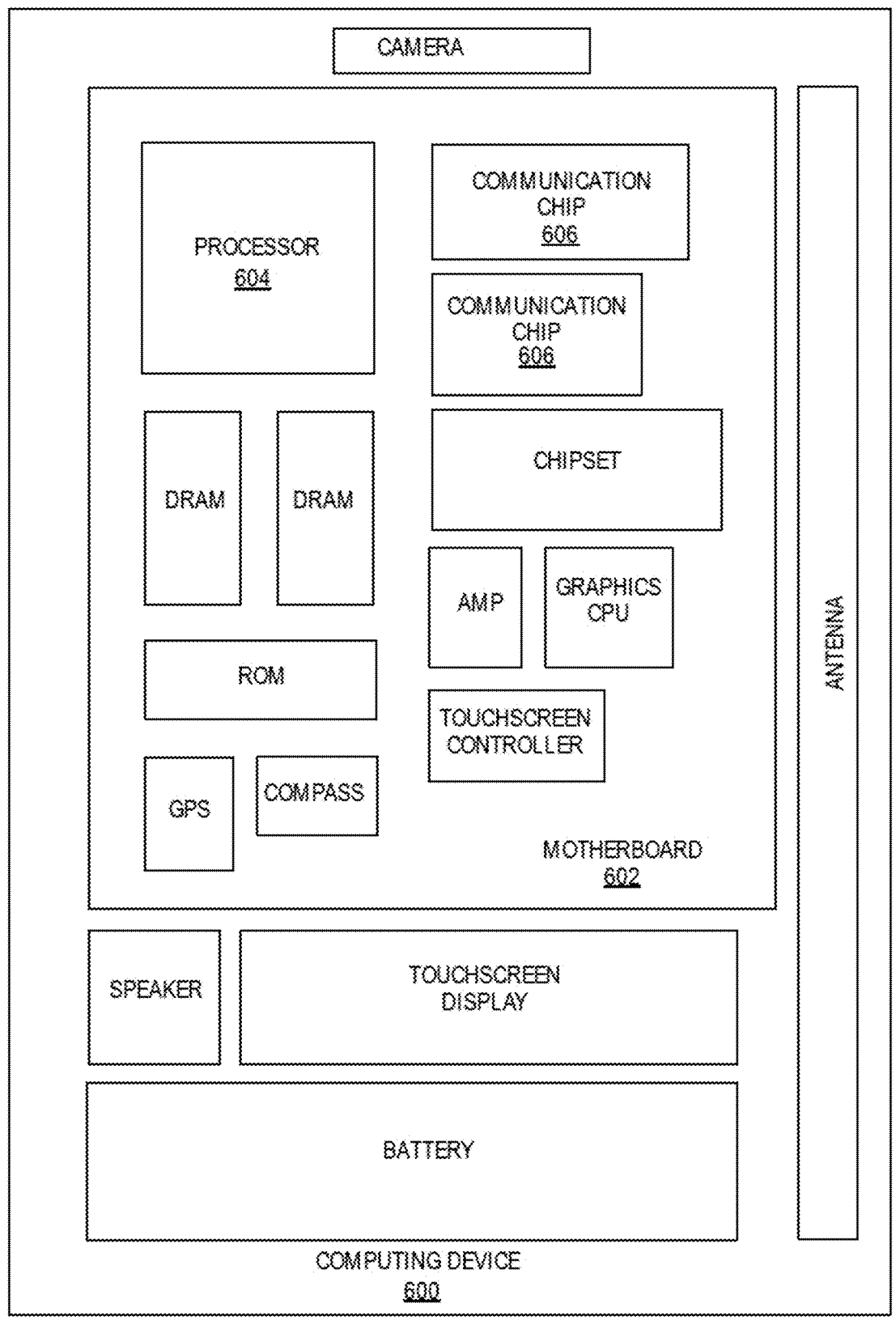
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be packaged to a package substrate that comprises an FLI bump that is electrically coupled to a first pad and a second pad, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip 606 may be packaged to a package substrate that comprises an FLI bump that is electrically coupled to a first pad and a second pad, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; an array of first level interconnect (FLI) bumps on the package substrate, wherein each FLI bump comprises a surface finish; a first pad on the package substrate, wherein the first pad comprises the surface finish, and wherein a first FLI bump of the array of FLI bumps is electrically coupled to the first pad; and a second pad on the package substrate, wherein the second pad is electrically coupled to the first pad.

Example 2: the electronic package of Example 1, wherein the second pad is a sacrificial pad.

Example 3: the electronic package of Example 1 or Example 2, wherein the second pad is partially covered by a solder resist.

Example 4: the electronic package of Example 3, wherein the second pad comprises a recess.

Example 5: the electronic package of Example 4, wherein a portion of the solder resist overhangs the recess.

Example 6: the electronic package of Example 4 or Example 5, wherein the recess comprises a substantially flat bottom surface.

Example 7: the electronic package of Examples 1-6, further comprising: a solder resist over the package substrate, wherein the first FLI bump extends up through the solder resist so that sidewall surfaces of the first FLI bump above the solder resist have a first surface area, wherein a first opening in the solder resist exposes a portion of the surface finish of the first pad having a second surface area, and wherein a second opening in the solder resist exposes a surface of the second pad having a third surface area.

Example 8: the electronic package of Example 7, wherein the first surface area is smaller than the third surface area.

Example 9: the electronic package of Example 8, wherein the third surface area is approximately ten times or more larger than the first surface area.

Example 10: the electronic package of Example 7 or Example 8, wherein the second surface area is approximately equal to the third surface area.

Example 11: the electronic package of Examples 1-10, wherein the surface finish comprises gold.

Example 12: the electronic package of Example 11, wherein the surface finish comprises electroless nickel, electroless palladium, immersion gold (ENEPIG).

Example 13: the electronic package of Examples 1-12, wherein a sidewall surface of the first FLI bump has a sidewall profile that is substantially similar to a sidewall profile of a second FLI bump of the array of FLI bumps, wherein the second FLI bump is electrically isolated from the first pad.

Example 14: an electronic system, comprising: an electronic package, wherein the electronic package comprises: a package substrate; a first array of first level interconnect (FLI) bumps on the package substrate; a first pad on the package substrate; and a second pad on the package substrate, wherein a first FLI bump of the first array of FLI bumps is electrically coupled to the first pad and the second pad; a first die electrically coupled to the electronic package by the first array of FLI bumps; and a capacitor electrically coupled to the first pad.

Example 15: the electronic system of Example 14, wherein the second pad comprises a recess.

Example 16: the electronic system of Example 15, wherein the second pad is covered by an electrically insulating layer.

Example 17: the electronic system of Examples 14-16, further comprising: a second array of FLI bumps on the package substrate; and a second die, wherein the second die is electrically coupled to the electronic package by the second array of FLI bumps.

Example 18: the electronic system of Example 17, further comprising: a bridge substrate embedded in the package substrate, wherein the bridge substrate electrically couples the first die to the second die.

Example 19: the electronic system of Example 18, wherein the first FLI bump is electrically coupled to the bridge substrate.

Example 20: the electronic system of Examples 14-19, wherein the first array of FLI bumps and the first pad comprise a surface finish.

Example 21: the electronic system of Example 20, wherein the surface finish comprises gold.

Example 22: the electronic system of Examples 14-21, further comprising: a board, wherein the board is electrically coupled to the package substrate.

Example 23: a method of forming an electronic system, comprising: providing an electronic package comprising: a package substrate; a solder resist over the package substrate; a first level interconnect (FLI) bump on the package substrate and extending through the solder resist; a first pad on the package substrate, wherein a first opening through the solder resist exposes a surface of the first pad; a second pad on the package substrate, wherein the solder resist covers an entire top surface of the second pad, wherein the FLI bump is electrically coupled to the first pad and the second pad; and a seed layer over a top surface of the solder resist; disposing a surface finish on the FLI bump and the first pad; forming a second opening through the solder resist to expose a surface of the second pad; and etching the seed layer, wherein the second pad is a sacrificial anode during the etching.

Example 24: the method of Example 23, wherein a recess is etched into the second pad during the etching.

Example 25: the method of Example 23 or Example 24, wherein the surface finish comprises gold, and wherein the gold catalyzes a reduction of peroxide in an etching chemistry.

What is claimed is:

1. An electronic package, comprising:
    a package substrate;
    an array of first level interconnect (FLI) bumps on the package substrate, wherein each FLI bump comprises a surface finish, and each of the FLI bumps on a corresponding pad;
    a first pad on the package substrate, wherein the first pad comprises the surface finish, and wherein a first FLI bump of the array of FLI bumps is electrically coupled to the first pad; and
    a second pad on the package substrate, wherein the second pad is electrically coupled to the first pad, wherein the second pad does not comprise the surface finish, and wherein the second pad, the first pad, and the corresponding pads are all at a same level.

2. The electronic package of claim 1, wherein the second pad is a sacrificial pad.

3. The electronic package of claim 1, wherein the second pad is partially covered by a solder resist.

4. The electronic package of claim 3, wherein the second pad comprises a recess.

5. The electronic package of claim 4, wherein a portion of the solder resist overhangs the recess.

6. The electronic package of claim 4, wherein the recess comprises a substantially flat bottom surface.

7. The electronic package of claim 1, further comprising:
    a solder resist over the package substrate, wherein the first FLI bump extends up through the solder resist so that sidewall surfaces of the first FLI bump above the solder resist have a first surface area, wherein a first opening in the solder resist exposes a portion of the surface finish of the first pad, the portion of the surface finish having a second surface area, and wherein a second opening in the solder resist exposes a surface of the second pad having a third surface area.

8. The electronic package of claim 7, wherein the first surface area is smaller than the third surface area.

9. The electronic package of claim 8, wherein the third surface area is approximately ten times or more larger than the first surface area.

10. The electronic package of claim 7, wherein the second surface area is approximately equal to the third surface area.

11. The electronic package of claim 1, wherein the surface finish comprises gold.

12. The electronic package of claim 11, wherein the surface finish comprises electroless nickel, electroless palladium, immersion gold (ENEPIG).

13. The electronic package of claim 1, wherein a sidewall surface of the first FLI bump has a sidewall profile that is substantially similar to a sidewall profile of a second FLI bump of the array of FLI bumps, wherein the second FLI bump is electrically isolated from the first pad.

* * * * *